United States Patent
Moss et al.

[11] Patent Number: 6,018,194
[45] Date of Patent: Jan. 25, 2000

[54] TRANSISTOR CLAMPING FIXTURE

[75] Inventors: James Francis Moss, Bradford, Mass.; David C. Wojewoda, Londonderry, N.H.; Richard G. Witty, Kinnelon, N.J.

[73] Assignee: Lucent Technologies Inc., Murray Hill, N.J.

[21] Appl. No.: 09/326,261

[22] Filed: Jun. 7, 1999

[51] Int. Cl.[7] .................................................. H01L 23/34
[52] U.S. Cl. ........................................ 257/727; 257/718
[58] Field of Search .................................... 257/727, 718, 257/726

[56] References Cited

U.S. PATENT DOCUMENTS

| | | |
|---|---|---|
| 4,692,790 | 9/1987 | Oyamada . |
| 5,451,165 | 9/1995 | Cearley-Cabbines et al. . |
| 5,705,853 | 1/1998 | Faller et al. . |
| 5,760,481 | 6/1998 | Murayama . |
| 5,770,891 | 6/1998 | Frandeny et al. . |
| 5,892,245 | 4/1999 | Hilton . |
| 5,917,240 | 6/1999 | Ideta et al. . |
| 5,936,849 | 8/1999 | Fetterman . |

*Primary Examiner*—Sheila V. Clark
*Attorney, Agent, or Firm*—Darby & Darby

[57] ABSTRACT

A removable transistor clamping fixture is disclosed which comprises an outer housing with a crosspiece configured to sit on top of the transistor. A U-shaped plunger straddles the crosspiece and has feet configured to rest on top of the transistor leads. One or more compression spring are placed between the top of the plunger and a coverplate so as to bias the plunger in a downward manner. When the clamping fixture is placed over a transistor, the crosspiece holds the transistor in place while the plunger feet apply a uniform downward pressure on the transistor leads of sufficient force to place the leads in electrical contact with an underlying printed circuit board. The clamping unit can be made largely from a plastic having a low dielectric constant to reduce the effect of the clamping fixture on the transistor's behavior.

10 Claims, 4 Drawing Sheets

ASSEMBLED VIEW

EXPLODED VIEW

FIG. 5
ASSEMBLED VIEW
FIG. 6
EXPLODED VIEW
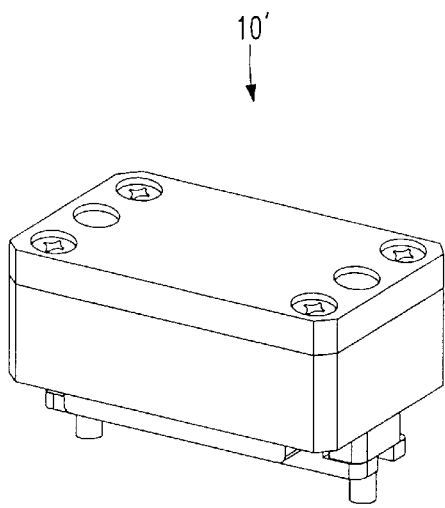
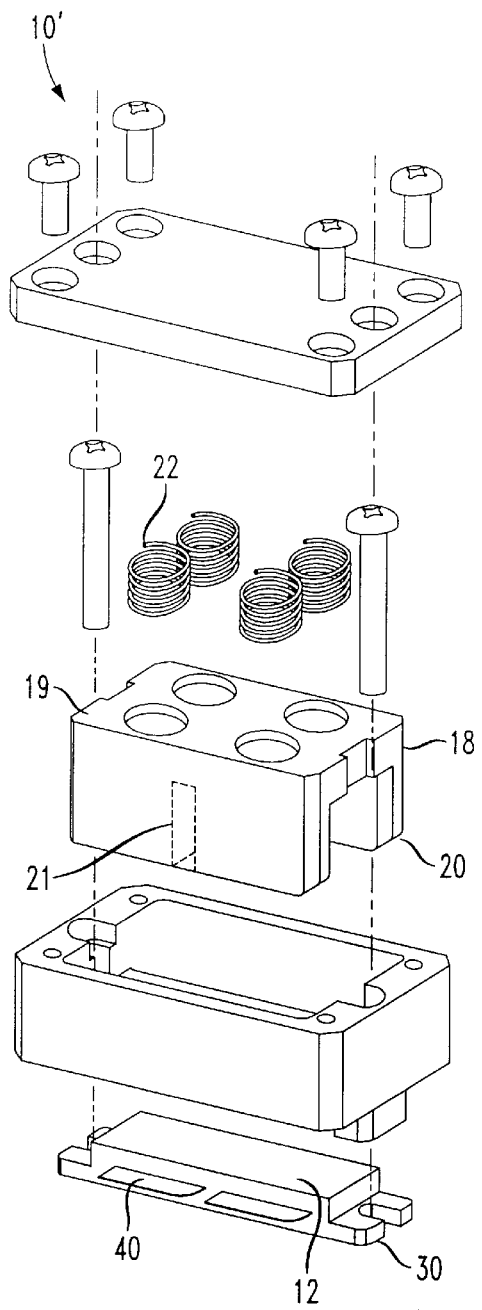

TRANSISTOR CLAMPING FIXTURE

FIELD OF THE INVENTION

This invention relates to a transistor clamping fixture design to allow transistors to be tested before they are soldered to a printed circuit board.

BACKGROUND OF THE INVENTION

For many high precision electronic circuits, the various components, particularly semiconductor devices such as transistors, must meet stringent design standards. Often, even if design and manufacturing tolerances are within the required range, the actual performance of a particular transistor is not the same as specified. In many cases, the discrepancy is not discovered until after the device is soldered onto the circuit board. This makes the task of identifying and subsequently replacing the faulty device time consuming and difficult. In addition, reworking the circuit board can often introduce other defects. To avoid this situation, it is desirable to test the performance of the transistors before they are soldered to the circuit board.

Various techniques have been utilized to attach or clamp a transistor to a circuit board for testing prior to soldering. However, these techniques suffer from one or more drawbacks. First, conventional transistor testing clamps tend to apply pressure to the transistor leads in a manner which is not uniform or well controlled. As a result, repeated testing of the same transistor may produce different results since the electrical characteristics of the contact made between the transistor lead and the testing equipment depends on the contact force applied to the leads. In addition, the non-uniform pressure can damage the transistor leads sufficiently to affect the performance of the transistor. A further drawback which is present in various conventional transistor clamping fixtures is the interaction between the clamp and the electrical fields of the transistor. During high precision testing, this interaction can skew the test results, resulting in misleading performance evaluations.

Accordingly, it would be advantageous to provide a transistor clamping fixture which allows a transistor to be temporarily attached to a circuit board without the use of solder. It would be also advantageous if such a clamping fixture applied pressure to the transistor leads in a uniform and repeatable matter. It would be a further advantage if such a transistor clamping fixture produced only minimal interference with the electric fields surrounding the operating clamped transistor.

SUMMARY OF THE INVENTION

A removable transistor clamping fixture allows for testing of transistors before they are soldered to a printed circuit board. According to the invention, the fixture comprises an outer housing with a crosspiece which is configured to sit on top of the transistor. A plunger passes through the housing, around the crosspiece, and has feet which are configured to rest on top of the transistor leads. One or more elastically compressible elements, such as springs, are used to bias the plunger in a downward manner. The springs are arranged so that the plunger applies a uniform downward pressure on the transistor leads which is sufficient to place the lead in electrical contact with an underlying printed circuit board. The clamping fixture can be fastened to the circuit board by screws which pass through the fixture and a mounting portion of the transistor, such as a heat sink or the transistor base. The clamping unit is made largely from a plastic having a low dielectric constant to reduce the effect of the transistor clamp on the electrical fields when the transistor is powered. Advantageously, a clamping fixture according to the invention can be used to test a transistor in the actual circuit in which it is to be used before soldering the transistor in place by producing an electrical contact with the circuit that is substantially equivalent to the contact provided by solder. After the circuit is powered and the transistor is tested, the clamping fixture can be easily removed and the transistor soldered in place or replaced, depending on the test results.

BRIEF DESCRIPTION OF THE DRAWINGS

The foregoing and other features of the present invention will be more readily apparent from the following detailed description and drawings of illustrative embodiments of the invention in which:

FIG. 5 is a perspective view of a transistor clamping fixture according to a second embodiment of the invention;

FIG. 6 is an exploded perspective view of the clamping fixture of FIG. 5; and

DETAILED DESCRIPTION OF THE PREFERRED EMBODIMENTS

Figure 1:
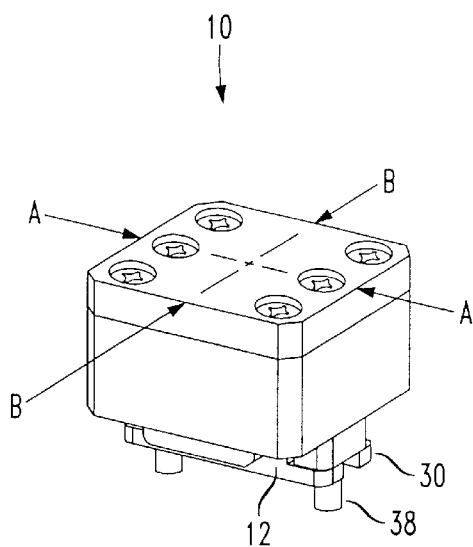
FIG. 1 is a perspective view of a transistor clamping fixture according to the invention.

FIG. 1 is a perspective view of a transistor clamping fixture 10 mounted over a transistor 12. In practice, the transistor is seated on a printed circuit board ("PCB") or testing station and an underlying substrate. For clarity, these elements have been omitted from the figure. The clamping fixture 10 is constructed to apply a uniform and controlled pressure to the horizontal lead of transistor 12 while also clamping the body of transistor 12 to the printed circuit board through the heat sink portion of the transistor, or other appropriate mounting means. For purposes of this and the following illustrations, transistor 12 is constructed so that one of its three (or more) terminals, generally the transistor base, comprises the heat sink portion of the transistor 12. However, the invention can also be used with transistors having other configurations with one or more horizontal leads and with other types of electrical components as well.

Figure 2:
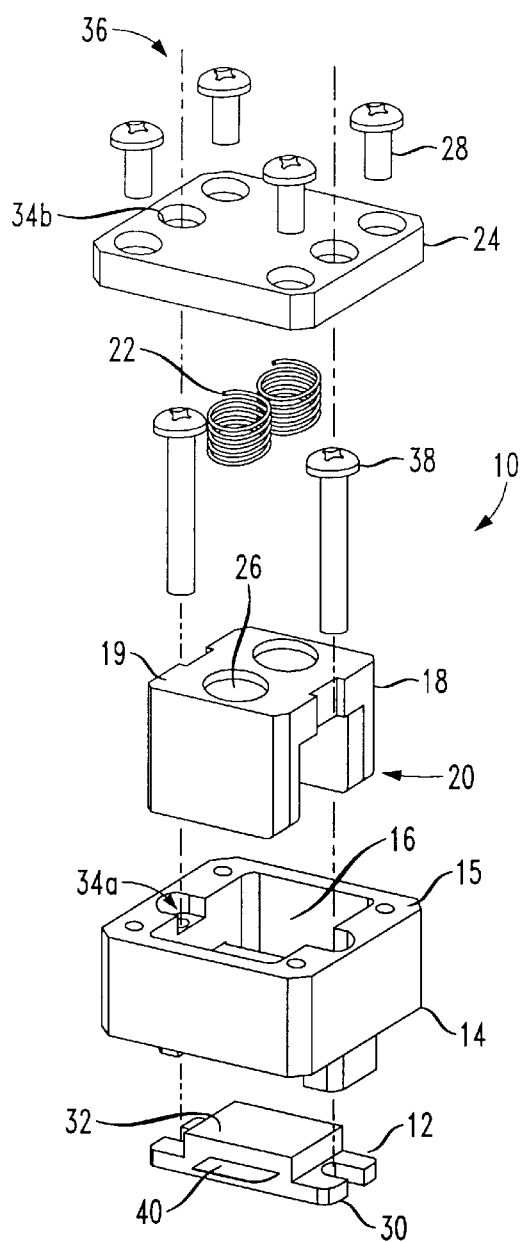
FIG. 2 is an exploded perspective view of the fixture of FIG. 1.

FIG. 2 is an exploded perspective view of the clamping fixture 10 illustrated in FIG. 1. The clamping fixture 10 comprises a generally hollow body 14 having a crosspiece 16 across the lower portion of body 14. A clamping plunger 18 having feet 20 is configured to pass through the body 14 and around the crosspiece 16 as shown. One or more resilient elements, such as springs 22, are situated between the top surface 19 of the plunger 18 and a cover plate 24. Corresponding recesses 26 can be formed in the top 19 of plunger 18 to aid in aligning springs 22. The cover plate 24 is attached to the top surface 15 of the body 14 by means of cover screws 28. However, cover plate 24 can be affixed by a variety of other means as well, such as adhesives, rivets, pegs, or, the like. The interlocking nature of the plunger 18 and cross piece 16 ensures that once the clamping fixture 10 is assembled, the plunger 18 can move freely up and down within the body 14.

The crosspiece 16 in the body 14 is configured to sit over a top surface 32 of the transistor 12. The housing of transistor 12 can include a mounting portion 30 used to attach the transistor 12 to a circuit board. If so, mounting apertures, such as aperture 34*a* in body 14 and aperture 34*b* in cover plate 24, are provided in alignment with the respective mounting area 30 of transistor 12. When assembled, as shown in FIG. 1, mounting screws 38 pass through the respective aperture 34*a*, 34*b*, the mounting area 30 of transistor 12, and into a supporting PCB or substrate (not shown).

The clamping plunger 18 is configured such that feet 20 rest on respective leads 40 of transistor 12 and press the leads downward with a uniform and controlled pressure provided by springs 22. The particular internal construction of the clamping fixture 10 will now be disclosed with the aid of the cross sectional views shown in FIGS. 3 and 4.

Figure 3:
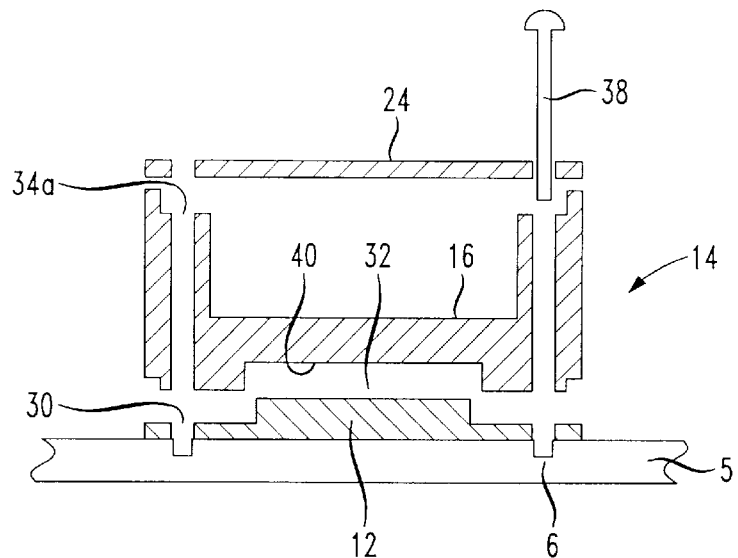
FIG. 3 is a partial cross section of the fixture of FIG. 1 along line A—A.

FIG. 3 is a cross-section of clamping fixture 10 along line A—A of FIG. 1 showing the internal construction of the body 14, particularly the crosspiece 16 relative to the transistor 12. Transistor 12 is shown placed on a substrate 5. The substrate 5 has mounting apertures 6 aligned with the transistor mounting portions 30. A mounting screw 38 passes through the appropriate apertures 34*a* in the body, mounting portions 30 in the transistor, and engages apertures 6 in the substrate 5 to mount the clamping fixture 10 and transistor 12 to the substrate 5.

In a preferred embodiment, as shown, the crosspiece 16 is configured with a lower surface 40 which substantially conforms to at least a portion of the top surface 32 of transistor 12. When the clamping fixture 10 is placed over transistor 12, the top 32 of transistor 12 generally abuts the bottom surface 40 of crosspiece 16 in a manner which provides a substantially even distribution of pressure across the top surface 32 of transistor 12.

Figure 4:
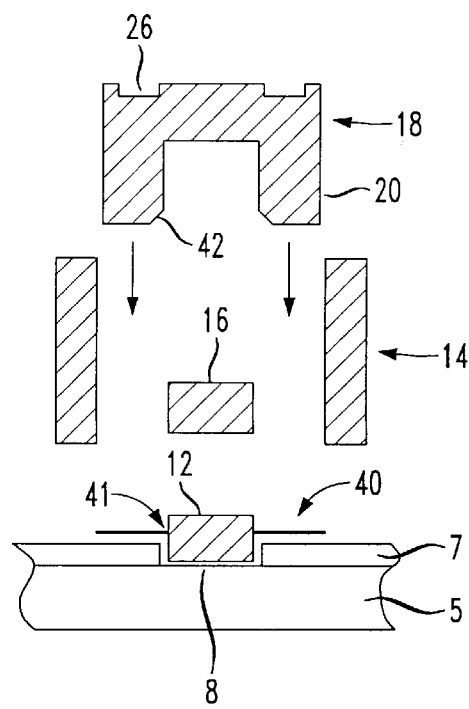
FIG. 4 is a partial cross section of the fixture of FIG. 1 along line B—B.

FIG. 4 is a partial cross-sectional view of the clamping fixture 10 along line B—B of FIG. 1, specifically illustrating the construction of the plunger 18 relative to the body 14 and transistor 12. The cover plate 24 and springs 22 have been omitted for clarity. As in FIG. 3, transistor 12 is shown in position on the top of substrate 5. In this view, substrate 5 has an upper printed circuit board area 7 with a slot 8 that is sized to receive the body of the transistor 12 with the leads 40 extending beyond the slot 8 and over the printed circuit board region 7. The plunger 18 is constructed so that each foot 20 is aligned a respective transistor lead 40. When pressure is exerted by plunger 18 on each lead 40, the leads are pressed into the top of PCB 7, thereby making electrical contact.

Preferably, feet 20 of plunger 18 are constructed so that they make contact with lead 40 near, but not immediately adjacent to the point 41 where the lead 40 enters the body of transistor 12 to prevent the lead from possibly being damaged as it is flexed when pressure is applied. In the preferred embodiments, each foot 20 of the plunger 18 has a beveled or curved inner edge 42. This permits the plunger 18 to fit snugly over a cross-piece 16 which is the same width as the transistor 12, while also preventing a shearing force from being applied to the lead adjacent the body of transistor 12.

A second embodiment of the invention is illustrated in the perspective and exploded perspective views of FIGS. 5 and 6. This embodiment is generally similar to the embodiment illustrated in FIGS. 1–4, but is constructed to engage a transistor having two or more leads on each side (or one very wide lead). In this construction, the plunger 18 is sized so that each foot 20 will engage the leads 40 on one side of the transistor 12. To ensure that force is evenly applied, springs 22 are arranged such that each spring rests on the top surface 19 of the plunger 18 in general alignment with a respective lead 40.

Although the embodiment shown in FIGS. 5 and 6 comprises a single plunger 18, in an alternative embodiment, a plurality of separate plungers 18 may be utilized each having feet which engage a pair of leads 40 on the transistor. The use of separate plungers may be particularly valuable when configuring a clamping fixture 10 that is designed to work with a transistor 12 having leads that are positioned at different heights on the side of the transistor body 12. In yet another alternative, a single plunger can be provided with more than two feet, as illustrated by phantom line 21 in FIG. 6.

According to a further aspect of the invention, the plunger 18, and preferably body 14 with cover plate 24, are comprised of a material having a low dielectric constant to prevent the clamping fixture 10 from disturbing the electric field generated by transistor 12 when it is operating. Most preferably, the plunger 18, body 14, and cover plate 44 are comprised of an acetyl homopolymer plastic, such as DEL-RIN™ produced by the DuPont Corporation of Wellington, Delaware. Because plastics of this type are insulators, capacitance is minimized, thus reducing the impact of the fixture on the electric fields surrounding the transistor, and therefore increasing the accuracy of the measurement to a point substantially equal to that obtained by physically soldering the transistor onto the circuit board. Plastics of this type may be easily fabricated into the desired components using conventional milling, injection molding, or other fabrication techniques known to those skilled in the art.

To allow the clamping fixture 10 to be repeatedly mounted and removed, the mounting screws 38 are preferably formed of a metal, such as brass or steel. The amount of metal present in such screws produces a minimal impact on the transistor fields. However, if extremely accurate measurements are required, screws of plastics or other materials having a low dielectric constant may be utilized instead. In addition, the springs 22 are preferably steel compression springs. Such springs are relatively easily to work with and provide uniform and repeatable spring pressure. However, springs and other materials may also be used as well as different spring types, such as leaf springs. Alternatively, springs 22 can be replaced with other types of resilient, compressible, or deformable members, such as rubber elements (solid or foamed), inflated air bladders, etc.

Figure 7:
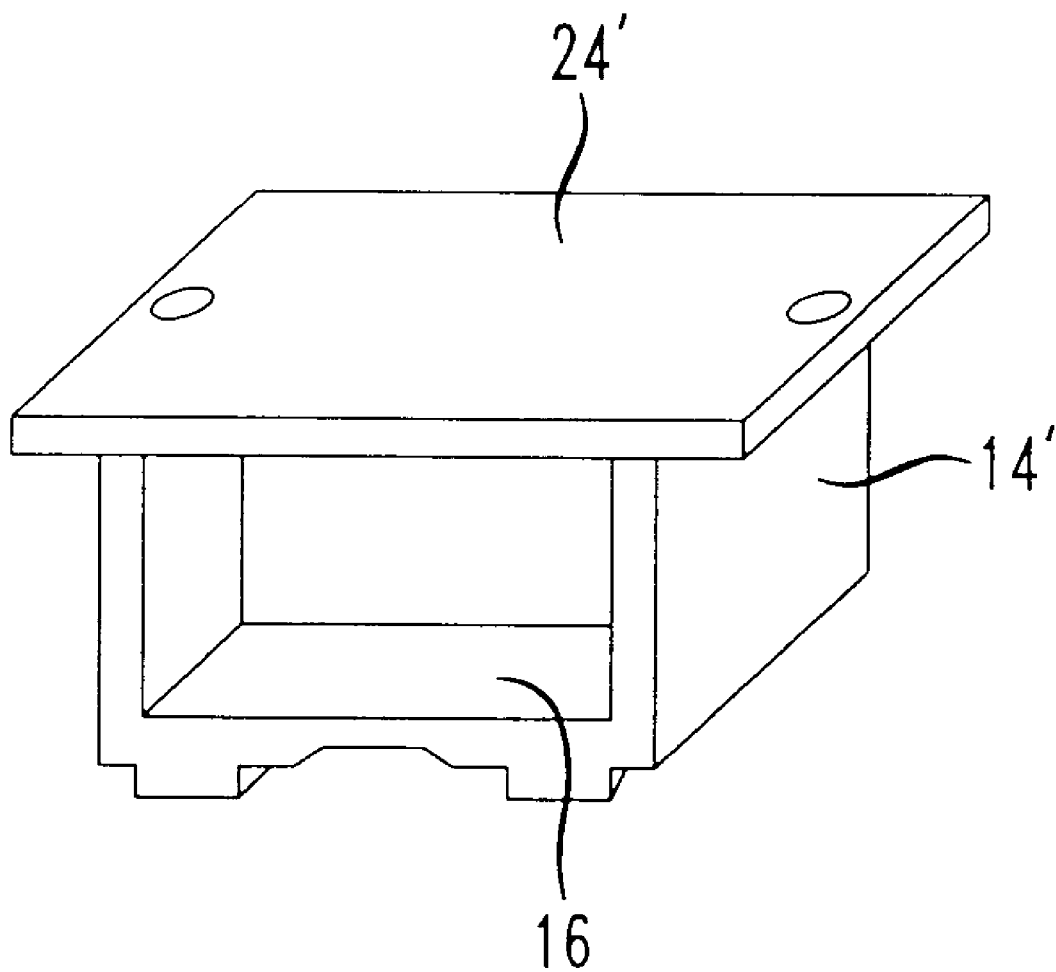
FIG. 7 is an alternative embodiment for the body of the clamping fixture of FIG. 1.

While the invention has been particularly shown and described with reference to the preferred embodiments thereof, it will be understood by those skilled in the art that the 20 various changes in form and details may be made therein without departing from the spirit and scope of the invention. For example, while the body 14 is shown as having an outer wall which extends completely around its periphery, the body only need include sufficient structure to support the crosspiece 16 and the biasing springs 22. Thus a large portion of the outer wall can be removed. Such a modified body 14' is illustrated in FIG. 7. As shown, the body 16' supports cross piece 16 and has a cover plate 24' to provide a top surface against which the plunger biasing springs 22 can push. Because the plunger may be inserted through the open side, the cover plate 24' can be integrally formed with the body 14'. Alternatively, cover plate 24 need not be affixed on top of the body 14, but instead can slide horizontally within slots in the body 14 and be retained in place by a detent mechanism or by friction. Other variations in the form and configuration of the disclosed transistor clamp are also possible while remaining within the scope of the invention.

We claim:

1. A transistor clamping fixture for temporarily mounting a transistor having a body with an upper surface and a plurality of horizontal leads onto a circuit board, the fixture comprising:

a body having a hollow inner region therein open on its lower end, an upper coverplate, and a substantially horizontal crosspiece within a lower portion of the inner region;

a generally U-shaped plunger having an upper surface having a downwardly extending foot, said plunger straddling the crosspiece; and a resilient element in contact with the upper surface of the plunger constructed and positioned to bias the plunger in a downward direction;

said crosspiece being positioned to engage the upper surface of the transistor and the plunger foot engaging a respective transistor lead when the clamping fixture is mounted over the transistor.

2. The transistor clamping fixture of claim 1, wherein said resilient element comprises an elastically compressible element positioned to be in general alignment with a transistor lead when the clamping fixture is mounted over the transistor.

3. The transistor clamping fixture of claim 2, wherein the upper surface of the plunger has a recess therein positioned to receive the elastically compressible element.

4. The transistor clamping fixture of claim 1, wherein the body has a plurality of mounting apertures therein for receiving respective mounting screws suitable for mounting the clamping fixture onto the circuit board.

5. The transistor clamping fixture of claim 1, wherein the crosspiece has a lower surface which substantially conforms to the upper portion of the transistor.

6. The transistor clamping fixture of claim 1, wherein said plunger has a plurality of feet each engaging a respective transistor lead at a position distant from a junction point between the respective transistor lead and the transistor body when the clamping fixture is mounted over the transistor.

7. The transistor clamping fixture of claim 6, wherein each plunger foot has a beveled inner edge overlying the junction of a respective lead with the transistor.

8. The transistor clamping fixture of claim 1, wherein said body is comprised of a material having a low dielectric constant.

9. The transistor clamping fixture of claim 8, wherein said material is an acetyl homopolymer plastic.

10. The transistor clamping fixture of claim 1, wherein said resilient elements comprise springs.

* * * * *